United States Patent
Shih et al.

(10) Patent No.: US 7,378,303 B2
(45) Date of Patent: May 27, 2008

(54) METHOD OF FABRICATING THIN FILM TRANSISTOR

(75) Inventors: Chih-Hung Shih, Yilan County (TW); Ta-Wen Liao, Miaoli (TW); Han-Tu Lin, Taichung County (TW); Feng-Yuan Gan, Hsinchu (TW)

(73) Assignee: AU Optronics Corp., Hsinchu (TW)

( * ) Notice: Subject to any disclaimer, the term of this patent is extended or adjusted under 35 U.S.C. 154(b) by 134 days.

(21) Appl. No.: 11/467,940

(22) Filed: Aug. 29, 2006

(65) Prior Publication Data

US 2007/0275511 A1 Nov. 29, 2007

(30) Foreign Application Priority Data

May 24, 2006 (TW) ............................... 95118412 A

(51) Int. Cl.
*H01L 21/84* (2006.01)

(52) U.S. Cl. ................. 438/149; 257/E51.005

(58) Field of Classification Search .......... 438/149, 438/70; 257/E51.005, E29.117, E29.137, 257/98, E29.151

See application file for complete search history.

(56) References Cited

U.S. PATENT DOCUMENTS 5,529,951 A * 6/1996 Noguchi et al. ............. 438/487
7,135,360 B2 * 11/2006 Chae et al. ................. 438/149
7,229,862 B2 * 6/2007 Yamazaki et al. .......... 438/151

* cited by examiner

*Primary Examiner*—Thao P. Le
(74) *Attorney, Agent, or Firm*—Thomas, Kayden, Horstemeyer & Risley

(57) ABSTRACT

A method for fabricating a thin film transistor is provided. A conductive layer is formed on a substrate. A patterned mask is formed on the conductive layer to cover a predetermined thin film transistor (TFT) area, and at least one portion of the conductive layer exposed by the patterned mask are removed. A laser is applied to form a laser hole in the patterned mask to expose a portion of the conductive layer and the laser hole substantially corresponds to a channel region of the predetermined TFT area. The exposed conductive layer is etched to form source and drain electrodes on opposite sides of the channel region.

16 Claims, 7 Drawing Sheets

METHOD OF FABRICATING THIN FILM TRANSISTOR

BACKGROUND OF THE INVENTION

1. Field of the Invention

The present invention relates to a fabrication method for a thin film transistor, and more particularly to a fabrication method utilizing laser ablation technology to simplify the manufacturing of thin film transistors.

2. Description of the Related Art

FIG. 1a to FIG. 1e illustrate a conventional process for manufacturing a thin film transistor in liquid crystal display using five photomasks. In FIG. 1a, a first conductive layer is formed on a substrate 100 by sputtering. Then, the first conductive layer is patterned to form a gate electrode 120 on the substrate 100 by a first photolithography and etching process beyond a predetermined thin film transistor area T.

In FIG. 1b, an insulating film 140, a semiconductor film 160, and an ohmic contact layer 180 are sequentially formed on the gate electrode 120. The semiconductor layer 160 and the ohmic contact layer 180 are patterned by a second photolithography and etching process to remove portions beyond the predetermined thin film transistor area T.

In FIG. 1c, a second conductive layer is formed on the substrate 100 by sputtering. The second conductive layer and the ohmic contact layer 180 underlying the second conductive layer are patterned by a third photolithography and etching process to form a drain electrode 200a and a source electrode 200b on the predetermined TFT area T. A portion of the semiconductor layer 160 exposed by an opening serves as a channel region. More specifically, the semiconductor layer 160 is exposed by an opening located between the drain electrode 200a and source electrode 200b.

In FIG. 1d, a passivation layer 220 covers the substrate 100 and the island shaped structure on the thin film transistor area T. The passivation layer 220 is then patterned by a fourth photolithography and etching process to form a contact hole 240 therein, thereby exposing a portion of the source electrode 200b.

In FIG. 1e, a pixel electrode 260 is formed on a portion of the passivation layer 220 and patterned by a fifth photolithography and etching process. The pixel electrode 260 is electrically connected to the source electrode 200b through the connect hole 240.

As mentioned above, the process for manufacturing the thin film transistor typically requires the use of five photomasks. Since manufacturing costs are greatly dependent upon the total number of photomasks used, it is a general object in the art to save the manufacturing costs by reducing the number of photomasks. It has been proposed in other fields, to use a laser ablation process to eliminate the need for photomasks to simplify the manufacturing steps. For example, in U.S. Patent Publication No. 20050064648, irradiation of the laser beam is performed on a photothermal converting layer to transfer heat and therefore sublimate a portion of a sublimation layer thereon. U.S. Patent Publication No. 20050258478 uses laser ablation to form a groove pattern in a semiconductor film.

BRIEF SUMMARY OF THE INVENTION

The present invention to provide a method of fabricating a thin film transistor that simplifies the manufacturing process by using laser ablation.

A method of fabricating a thin film transistor comprising: forming a conductive layer on a substrate, forming a patterned mask on the conductive layer to cover a predetermined TFT area, removing at least one portion of the conductive layer not covered by the patterned mask, applying a laser to form a laser hole in the patterned mask to expose a portion of the conductive layer and the laser hole substantially corresponding to a channel region of the predetermined TFT area, and etching the exposed conductive layer to form a source electrode and a drain electrode on opposite sides of the channel region of the predetermined TFT area.

A detailed description is given in the following embodiments with reference to the accompanying drawings.

BRIEF DESCRIPTION OF THE DRAWINGS

The accompanying drawings illustrate one or more embodiments of the present invention and, together with the written description, serve to explain the principles of the present invention. Wherever possible, the same reference numbers are used throughout the drawings to refer to the same or like elements of an embodiment, and wherein.

DETAILED DESCRIPTION OF THE INVENTION

The following description is of the embodiment of carrying out the present invention. This description is made for the purpose of illustrating the general principles of the present embodiment of the invention and should not be taken in a limiting sense.

Figure 1A:
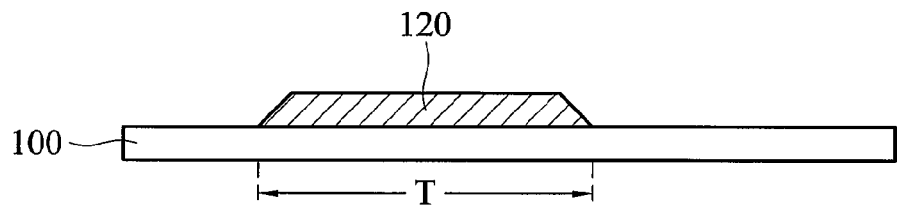
FIG. 1a to FIG. 1e are cross-sections illustrating the conventional process steps of fabricating a thin film transistor using five photomasks.
Figure 1B:
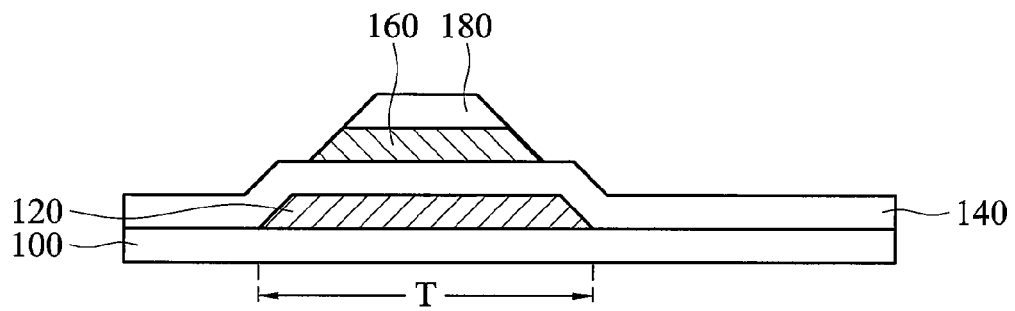
Figure 1C:
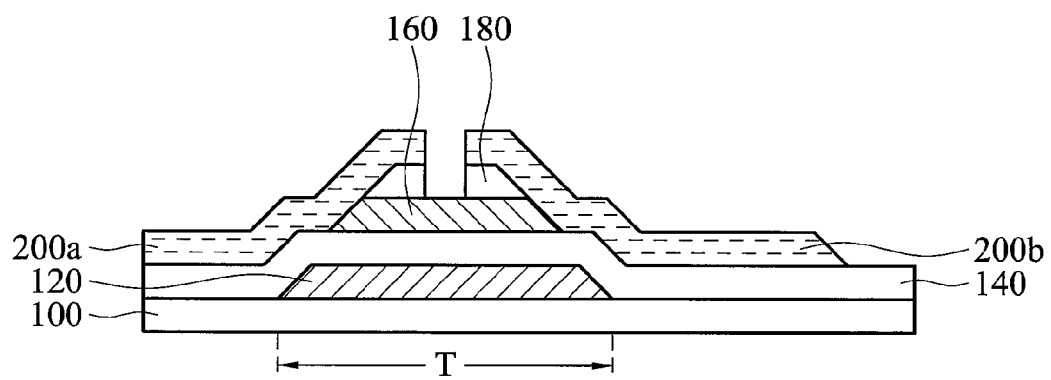
Figure 1D:
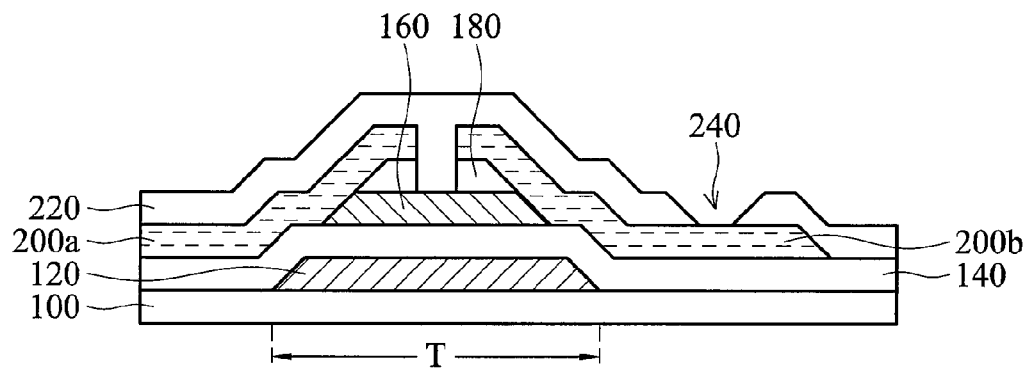
Figure 1E:
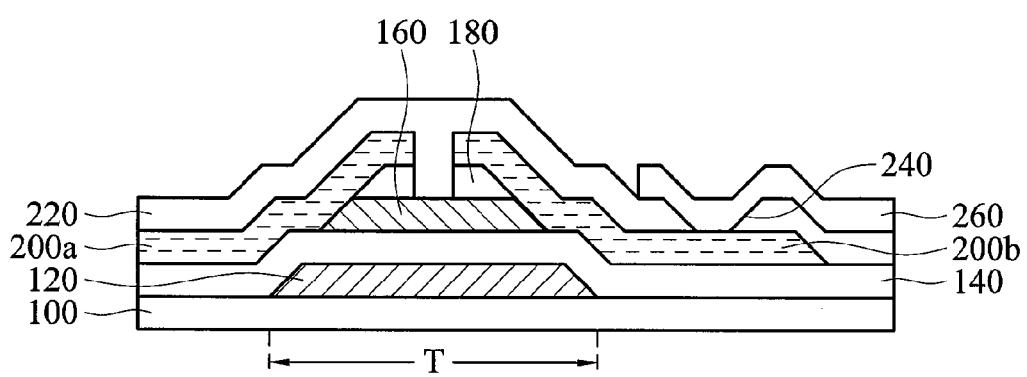
Figure 2:
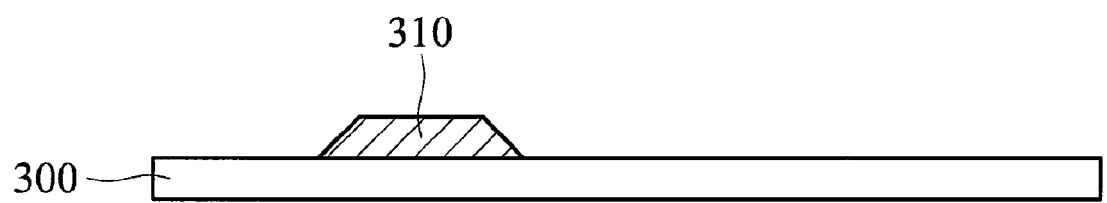
FIG. 2 to FIG. 10 are cross-sections illustrating the process steps of fabricating the thin film transistor according to a preferred embodiment of the present invention.

As illustrated in FIG. 2, a conductive layer is formed on the substrate 300 and patterned by a first photolithography and etching process to form a gate electrode 310. Generally, the substrate 300 is a rigidity substrate such as glass, quartz, ceramic, or silicon substrate, but it may be a flexible substrate such as a plastic substrate when applied to flexible displays. Suitable materials for flexible substrates include, but are not limited to, polyethersulfone (PES), polyethylenenaphthalate (PEN), polyethylene (PE), polyimide (PI), polyvinyl chloride (PVC), polyethylene terephthalate (PET), or combinations thereof. Moreover, the substrate 300 may be formed of transparent or opaque materials, and when it is applied to OLED (organic electroluminescence light device) or flexible display field, the substrate 300 may be formed by metal substrate.

Figure 3:
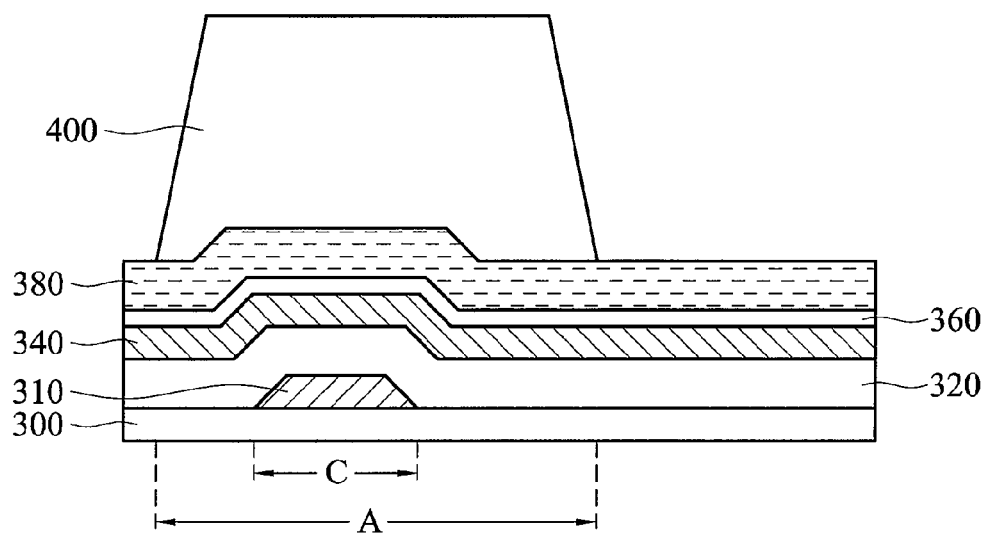
Figure 4:
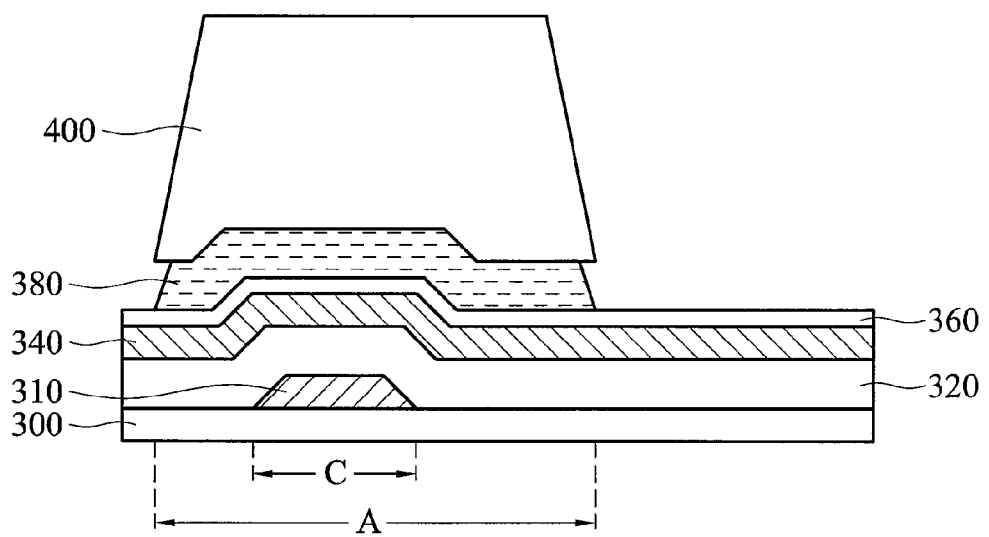

Next, an insulating layer 320, a semiconductor layer 340, an ohmic contact layer 360, a conductive layer 380 and a photoresist as an etch-protective mask are sequentially formed on the substrate 300 and the gate electrode 310. The photoresist is patterned by a second photolithography process, and as illustrated in FIG. 3, the patterned photoresist 400 (namely patterned mask) covers a portion of the conductive layer 380 on a predetermined thin film transistor area A. Referring to FIG. 4, at least the portion of the conductive layer 380 not covered by the patterned photoresist 400 are removed by anisotropic etching. The material of the semiconductor layer 340 and ohmic contact layer 360 includes, but is not limited to, amorphous silicon, polysilicon, micro-crystal silicon, single crystal silicon, or combinations thereof. The ohmic contact layer 360 may contain n type dopant or p type dopant.

Figure 5:
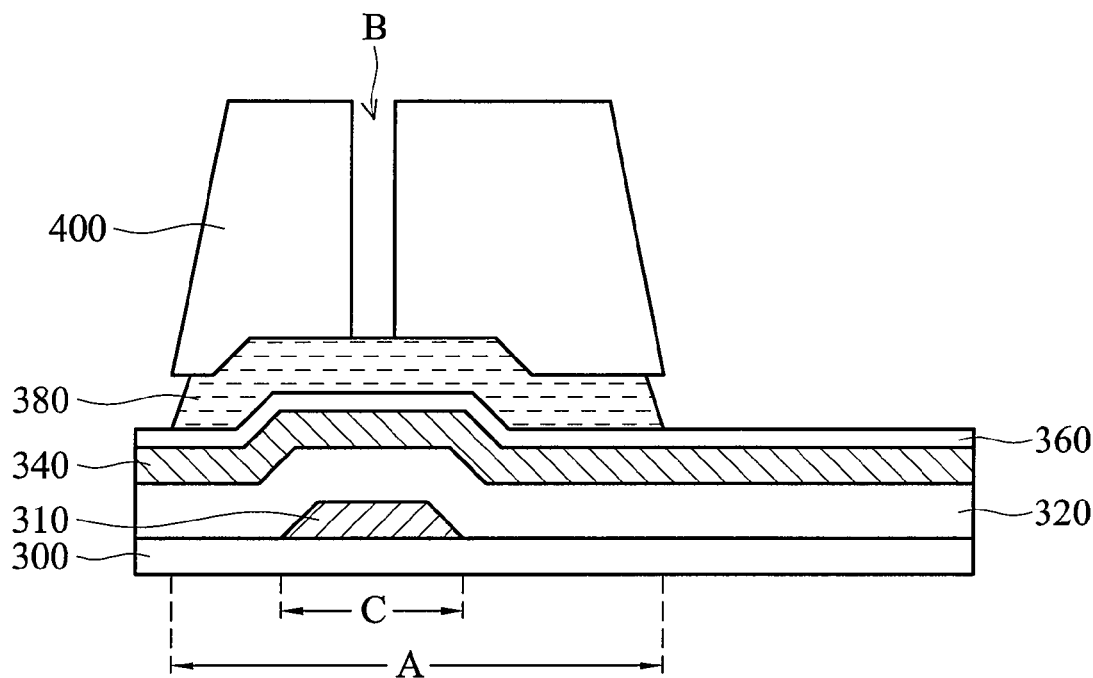
Figure 6:
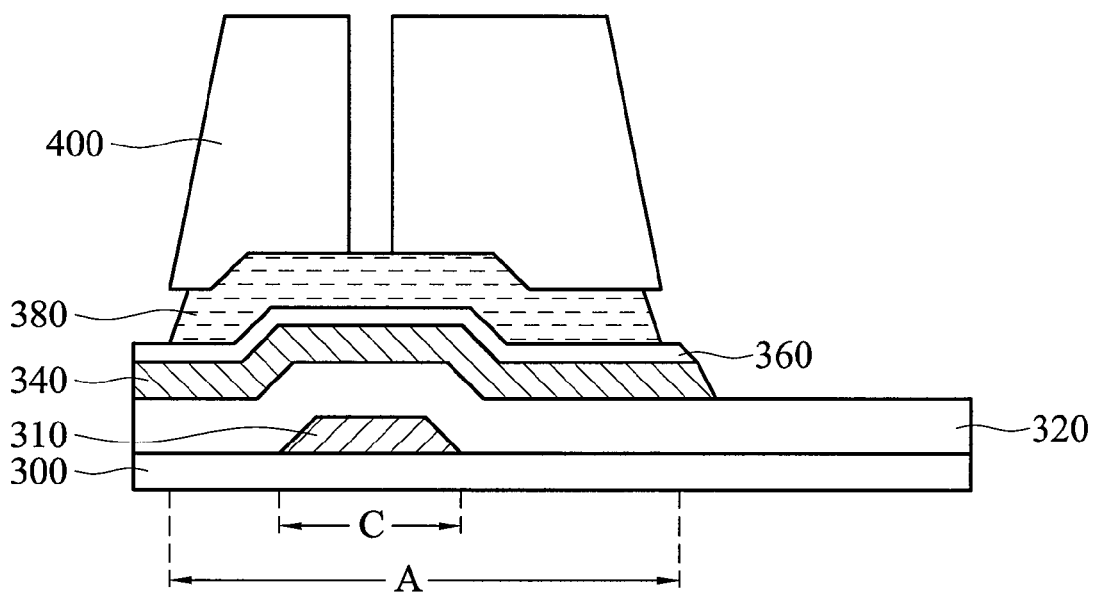
Figure 7:
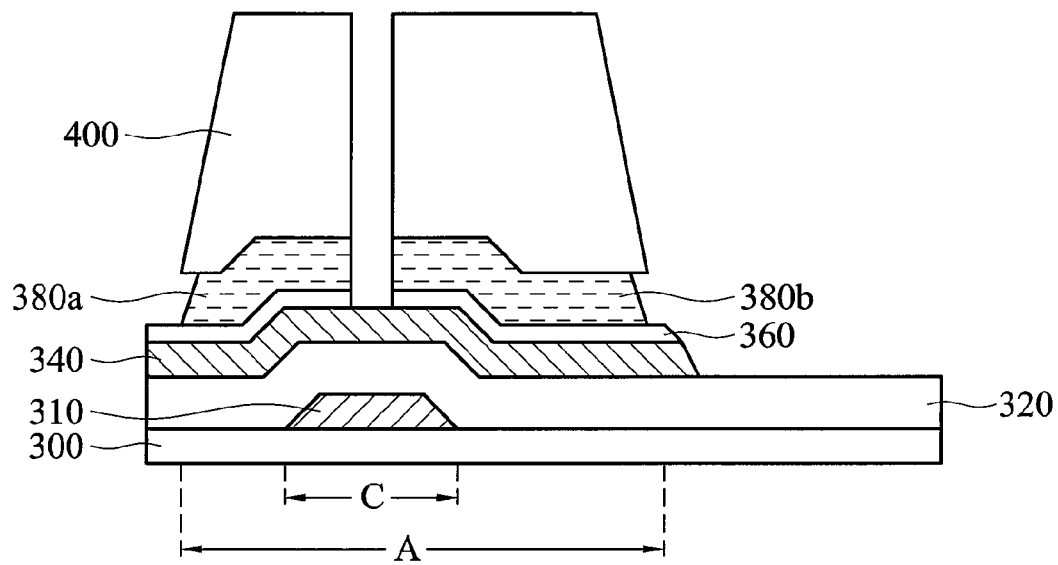
Figure 8:
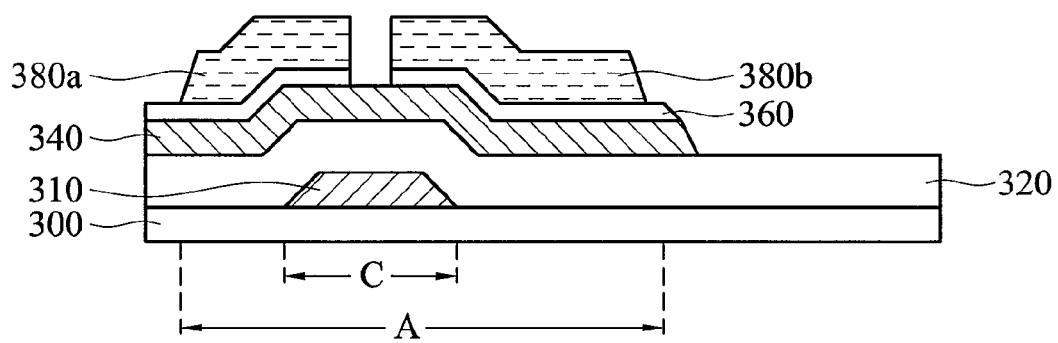

In FIG. 5, applying energy of a laser beam irradiate to a portion of the patterned photoresist 400, and then the portion of the patterned photoresist 400 is removed by the laser ablation process to form a laser hole B therein, which exposes the conductive layer 380 located on a predetermined channel region C of the predetermined thin film transistor area A. In other words, the laser hole B is substantially corresponding to the conductive layer 380 located on the predetermined channel region C. Subsequently, the ohmic contact layer 360 and the semiconductor layer 340 beyond the predetermined thin film transistor area A is removed by anisotropic etching or isotropic etching. In other words, at least one portion of the ohmic contact layer 360 and at least one portion of the semiconductor layer 340 not covered by the patterned photoresist 400 are removed by anisotropic etching or isotropic etching. During etching, the conductive layer 380 located on the predetermined channel region C as a protective layer to prevent the underlying ohmic contact layer 360 and semiconductor layer 340 from being etched. The structure after the etching process is shown in FIG. 6. Although in the illustrated embodiment the etching process is performed following the laser ablation process that defines the laser hole B, it is noted, however, that this etching step can be performed prior to the laser ablation without affecting the result. Next, the conductive layer 380 and the ohmic contact layer 360 under the laser hole B are sequentially etched to define a drain electrode 380a and source electrode 380b located on opposite sides of the channel region C of the predetermined thin film transistor area A, as shown in FIG. 7. The photoresist layer 400 is then removed, resulting in the structure as shown in FIG. 8. Rather than conventional use of a photomask to define the pattern of the photoresist 400, the present embodiment of the invention uses a laser ablation process, obviating the need for a photomask and thus conserving manufacturing costs.

In laser ablation, digital exposure technique may be used to align the laser beam position and to control the power thereof automatically. Furthermore, although not necessarily required, a photomask may be used to help the alignment of the laser beam to define the laser hole B in the patterned photoresist layer 400.

Figure 9:
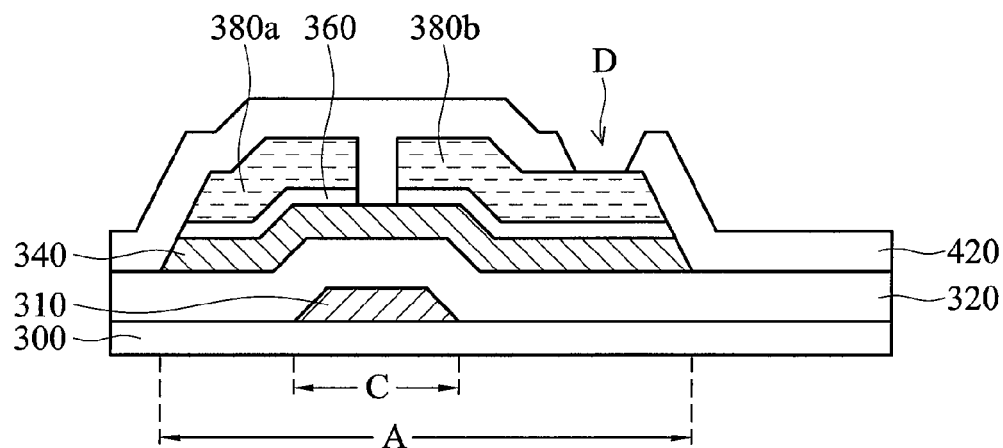
Figure 10:
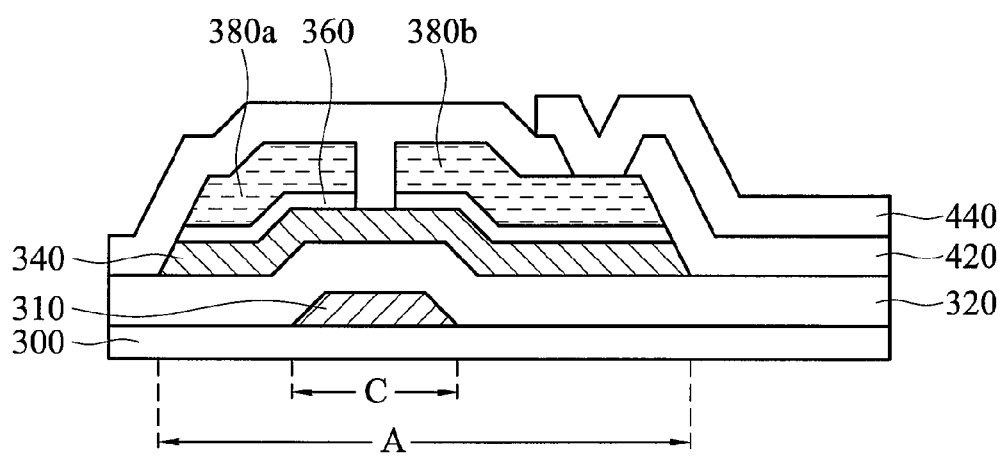

Next, as illustrated in FIG. 9, a passivation layer 420 is formed on the conductive layer 380 including the drain electrode 380a and the source electrode 380b, and patterned by a third photolithography and etching process to define a contact hole D that exposes a portion of the source electrode 380b or a portion of the drain electrode 380a. As shown in FIG. 10, a pixel electrode 440 is formed on a portion of the passivation layer 420 and patterned using a fourth photolithography and etching process. The pixel electrode 440 is electrically connected to the source electrode 380b or the drain electrode 380a through the contact hole D. The pixel electrode 440 can be a transparent or reflective electrode dependent on display type. Suitable materials for the transparent electrode include, but are not limited to, aluminum zinc oxide (AZO), indium zinc oxide (IZO), indium tin oxide (ITO), cadmium tin oxide (CTO), or like as. Suitable materials for the reflective electrode include, but are not limited to, gold, silver, copper, iron, aluminum, titanium, tantalum, molybdenum, rubidium, tungsten, and alloys, or combinations thereof. In addition, the pixel electrode can be of trans-flective materials or a combination of transparent material and reflective material. In other words, the transparent material and the reflective material are covering the portion of the passivation layer 420, and the portion of the transparent material is covering the portion of the reflective material by each other. Moreover, the material of the conductive layer 380 and the gate electrode 310 may be the same as the pixel electrode 440.

The pixel electrode 440 is adopted to provide a voltage to a luminescence layer (not shown) or liquid crystal layer. In other words, forming the luminescence layer on at least one portion of the pixel or filling the liquid crystal layer between the substrate 300 and other substrate (not shown), the liquid crystal layer contact with the pixel electrode. The luminescence layer may include inorganic materials used in light emitting device (LED) or organic materials used in electroluminescence light device (ELD) such as OLED (organic light emitting device) or PLED (polymer light emitting device).

The laser ablation of the embodiment of the present invention can be applied to the manufacture of color filters, such as the thin film transistor formed on a color filter namely array on color filter (AOC), or the color filter formed on the thin film transistor namely color filter on array (COA) designs.

While the present invention has been described by way of example and in terms of preferred embodiment, it is to be understood that the present invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for fabricating a thin film transistor (TFT), comprising:
    forming a conductive layer on a substrate;
    forming a patterned mask on the conductive layer to cover a predetermined TFT area on the substrate;
    removing at least one portion of the conductive layer not covered by the patterned mask;
    applying a laser to form a laser hole in the patterned mask to expose a portion of the conductive layer and the laser hole substantially corresponding to a channel region of the predetermined TFT area; and
    etching the exposed conductive layer to form a source electrode and a drain electrode on opposite sides of the channel region of the predetermined TFT area.

2. The method according to claim 1, further comprising forming a gate electrode, an insulating layer, a semiconductor layer on the substrate in sequence, so that the insulating layer covers the gate electrode and the substrate, that the semiconductor layer is formed on a portion of the insulating layer, and that the conductive layer is formed on the semiconductor layer.

3. The method according to claim 2, further comprising removing at least one portion of the semiconductor layer not covered by the patterned mask.

4. The method according to claim 2, further comprising forming an ohmic contact layer between the semiconductor layer and the conductive layer.

5. The method according to claim 4, further comprising removing at least one portion of the ohmic contact layer not covered by the pattered mask.

6. The method according to claim 4, further comprising etching the ohmic contact layer exposed by the laser hole.

7. The method according to claim 1, further comprising removing the pattered mask.

8. The method according to claim 1, further comprising forming a passivation layer on the conductive layer.

9. The method according to claim 8, further comprising forming a pixel electrode on a portion of the passivation layer.

10. The method according to claim 9, further comprising forming a luminescent layer on at least one portion of the pixel electrode, wherein the pixel electrode is adapted to provide a voltage to the luminescent layer.

11. The method according to claim 9, wherein the luminescent layer comprises organic material or inorganic material.

12. The method according to claim 1, wherein the substrate comprises flexible material, opaque material, or transparent material.

13. The method according to claim 12, wherein the flexible substrate comprises polyethersulfone, polyethylenenaphthalate, polyethylene, polyimide, polyvinyl chloride, polyethylene terephthalate, or combinations thereof.

14. The method according to claim 12, wherein the pixel electrode comprises transparent material, reflective material, or combinations thereof.

15. The method according to claim 12, further comprising forming a color filter over the substrate.

16. The method according to claim 12, further comprising forming a color filter on the TFT.

* * * * *